(12) United States Patent
Throngnumchai et al.

(10) Patent No.: US 6,580,625 B2
(45) Date of Patent: Jun. 17, 2003

(54) POWER SUPPLY CIRCUIT FOR DRIVING POWER TRANSISTOR

(75) Inventors: Kraisorn Throngnumchai, Yokohama (JP); Hiroyuki Kaneko, Yokohama (JP); Yoshio Shimoida, Yokosuka (JP); Toshirou Karaki, Yokosuka (JP)

(73) Assignee: Nissan Motor Co., Ltd., Kanagawa (JP)

( * ) Notice: Subject to any disclaimer, the term of this patent is extended or adjusted under 35 U.S.C. 154(b) by 0 days.

(21) Appl. No.: 10/086,834

(22) Filed: Mar. 4, 2002

(65) Prior Publication Data

US 2002/0125873 A1 Sep. 12, 2002

(30) Foreign Application Priority Data

Mar. 12, 2001 (JP) ......................................... 2001-068382

(51) Int. Cl.$^7$ .................................................. H02M 3/24
(52) U.S. Cl. .................... 363/97; 323/289; 327/109; 327/110; 327/375; 363/132
(58) Field of Search ................................. 323/272, 289, 323/290; 327/108–112, 374–379, 427; 363/97, 98, 50, 76, 77, 131, 132, 56.02

(56) References Cited

U.S. PATENT DOCUMENTS

| 4,200,813 A | * | 4/1980 | Van Schaik et al. | ........ 327/375 |
| 4,967,101 A | * | 10/1990 | Nakamura et al. | .......... 327/109 |
| 5,168,182 A | * | 12/1992 | Salerno et al. | ................. 326/98 |
| 5,963,078 A | * | 10/1999 | Wallace | ....................... 327/432 |

OTHER PUBLICATIONS

Hoda, et al. "*Controller For Fork Lift Using SIT*" Toyoda Industries Corporation K.K., Proceedings of Electronic Device Study Group, vol. EDD–90–64, pp. 57–64, 1990 year no month.

* cited by examiner

Primary Examiner—Michael Sherry
Assistant Examiner—Gary L. Laxton
(74) Attorney, Agent, or Firm—McDermott, Will & Emery (57) ABSTRACT

There are included a switching circuit for flowing pulse electrical current through a primary winding of a transformer, a half wave rectification circuit or a full wave rectification circuit for extracting electrical current from a secondary winding of the transformer while this pulse electrical current flows, and an electrical current regulation circuit which controls the magnitude of the electrical current which is extracted from the secondary winding of the transformer according to the collector voltage of the power transistor. Since the most suitable pulse electrical current is made directly from the direct current power supply and is supplied to the base of the power transistor, there is no requirement to provide any DC-DC converter, and it is possible to reduce the size and the cost of the power supply circuit for driving the power transistor.

8 Claims, 6 Drawing Sheets

POWER SUPPLY CIRCUIT FOR DRIVING POWER TRANSISTOR

BACKGROUND OF THE INVENTION

1. Field of the Invention

The present invention relates to a technique for providing a power supply circuit for driving a power transistor which is compact.

2. Description of the Related Art

There is a per se known drive circuit for a power transistor according to the prior art which is disclosed, for example, in "Controller for Fork Lift using SIT" by Tamotsu Hoda and Toshio Yoshizawa, Toyoda Industries corporation K.K., Proceedings of Electronic Device Study Group, vol. EDD-90–64, pp. 57–64, 1990.

Figure 6A:
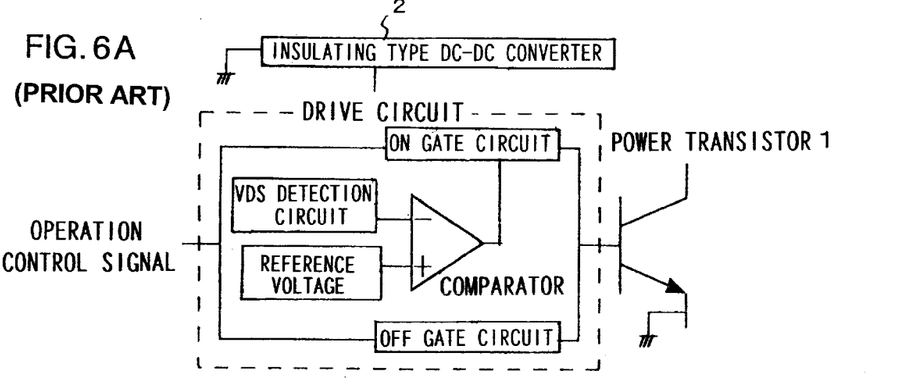
Figure 6B:
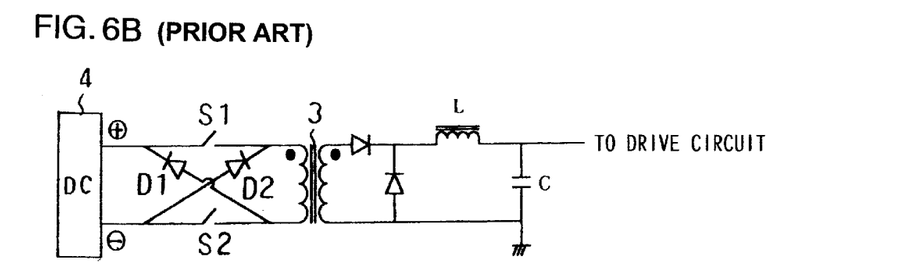
FIG. 6B shows the circuit structure of a forward type DC-DC converter.
Figure 6C:
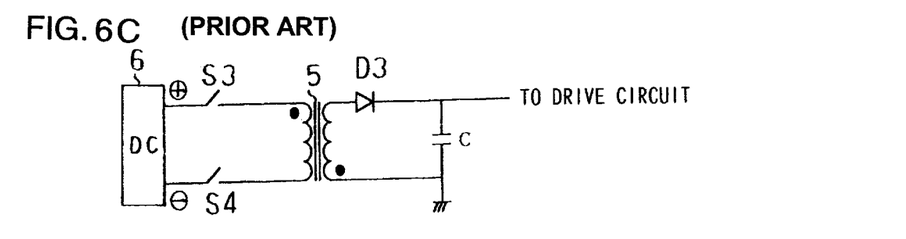
FIG. 6C shows the circuit structure of a flyback type DC-DC converter.

FIGS. 6A through 6C are figures showing the structure of a prior art drive circuit for a power transistor. FIG. 6A is a figure showing the overall structure of this drive circuit. With such a prior art type drive circuit for a power transistor, optimization of the base electrical current from the low electrical current region all through to the high electrical current region is implemented as a measure in order not to over-saturate the power transistor 1. In other words, the electrical current which is supplied to the base of the power transistor 1 is controlled by a drive circuit which employs a comparator or an ON gate circuit while an operation control signal which controls the operation and stopping of the load is ON, so that, if the power transistor 1 becomes over-saturated, the supply of electrical current to the base thereof is temporarily terminated. Useless supply of base electrical current is prevented by performing control in this manner.

As described above, by performing ON/OFF control of the electrical current which is supplied to the base of the power transistor, the most suitable base electrical current is supplied, as an average, according to the time period width of the ON/OFF cycle. When the base electrical current is thus optimized, not only is it possible to shorten the storage time of the power transistor, but also it is possible to make the drive power supply circuit (in the figure, the insulating type DC-DC converter 2) smaller.

Moreover it is possible to control the load electrical current with the power transistor 1, since in the circuit shown in FIG. 6A the collector terminal of the power transistor 1 is connected to the power supply via the load.

FIG. 6B is a circuit diagram of an insulating type DC-DC converter according to the related art which is used in the circuit shown in FIG. 6A. The circuit shown in FIG. 6B is termed a forward type DC-DC converter. The operation of such a forward type DC-DC converter will now be explained.

When the switches S1 and S2 which are incorporated in this switching circuit are turned ON, electrical current is supplied to the primary side and to the secondary side of the transformer 3. The electrical current which flows in the secondary side flows through a choke coil L to a capacitor C and a drive circuit which is constituted by the load. The flow of energy at this time will now be explained. Energy is supplied to the transformer 3 from a direct current power supply 4. A portion of the energy which is supplied to the transformer 3 is accumulated in the core of the transformer 3, and excites the transformer 3. The remainder of the energy is transferred to the secondary side via the transformer 3 which has been excited. Of this energy which has been transferred to the secondary side, a portion is supplied to the load, while the remainder is accumulated in the choke coil L and the capacitor C.

After this, when the switches S1 and S2 are turned OFF, the excitation energy which has been accumulated in the core of the transformer 3 is returned to the direct current power supply 4 via diodes D1 and D2 on the input side (the side of the direct current power supply 4). The energy which has been accumulated in the choke coil L and the capacitor C is supplied to the load. In this manner it is possible to supply energy to the load, both when the switches S1 and S2 are ON and when they are OFF.

With the forward type DC-DC converter, it is necessary to accumulate the energy which is to be supplied to the load while the switches are OFF in the choke coil L. The maximum amount of energy per unit volume which can be accumulated in the choke coil L is determined by the characteristics of the magnetic material from which the choke coil L is manufactured, and therefore a large choke coil is required for accumulating a large amount of energy.

Generally, a control circuit is used which employs feedback, in order to stabilize the output electrical current from such a DC-DC converter, although this matter is not shown in the figure. Thus, the size and the cost of such a DC-DC converter are negatively impacted by the use of such a feedback circuit.

FIG. 6C is a circuit diagram of another insulating type DC-DC converter in the related art. The circuit shown in FIG. 6C is termed a flyback type DC-DC converter. The operation of such a flyback type DC-DC converter will now be explained.

When the switches S3 and S4 are turned ON, electrical current is supplied to the primary side of the transformer 5. At this time, energy from a direct current power supply 6 is supplied to the transformer 5, and energy is accumulated in the core of the transformer 5. However, in this case, the primary winding and the secondary winding of the transformer 5 are wound in opposite directions. Accordingly, no electrical current flows in the secondary side of the transformer 5, due to the provision of a diode D3. In other words, the energy which is accumulated in the core of the transformer 5 is not supplied to the secondary side of the transformer 5.

After this, when the switches S3 and S4 are turned OFF, the excitation energy which has been accumulated in the core of the transformer 5 flows via the diode D3 on the secondary side of the transformer 5 to a capacitor C and to the load.

With the above described flyback type DC-DC converter, since energy is not supplied to the secondary side of the transformer 5 while the switches S3 and S4 are ON, accordingly the energy which has been accumulated in the capacitor C is supplied to the load. Thus a large transformer is required, since it is necessary to accumulate energy in the core of the transformer while the switches are ON.

Furthermore, with this flyback type DC-DC converter, too, a feedback type control circuit is used in order to stabilize the output electrical current.

SUMMARY OF THE INVENTION

As shown in FIG. 6A, with a drive circuit for a power transistor according to the prior art, the most suitable pulse electrical current is obtained for driving the power transistor by supplying the output of the DC-DC converter to the base of the power transistor 1 via an ON gate circuit which can be selectively interrupted. Since as explained above the size of the DC-DC converter is determined by the amount of energy which it must supply, it is difficult to reduce the size of the circuit. Moreover, reduction in circuit size is also impeded by the requirement to provide a comparator or the like for generating the pulse electrical current.

Thus, the objective of the present invention is to provide a power supply circuit for driving a power transistor which is compact.

According to the present invention, the power supply circuit for driving a power transistor comprises: a direct current power supply; a transformer; a switching circuit which flows pulse electrical current through a primary winding of the transformer by connecting both ends of the primary winding of the transformer to both output ends of the direct current power supply in positive and negative directions alternately; a half wave rectification circuit which allows electrical current to flow in a secondary winding of the transformer when electrical current flows in the primary winding of the transformer in one or the other of the positive direction and the negative direction, or a full wave rectification circuit which allows electrical current to flow in the secondary winding of the transformer when electrical current flows in the primary winding of the transformer in either one of the positive direction and the negative direction; and an electrical current regulation circuit which is provided between an output of the half wave rectification circuit or the full wave rectification circuit and a control terminal of the power transistor, and whose resistance value changes according to a collector voltage of the power transistor.

BRIEF DESCRIPTION OF THE DRAWINGS

FIG. 6A is an overall schematic figure showing a drive circuit for a power transistor according to the prior art, while

DETAILED DESCRIPTION OF THE PREFERRED EMBODIMENTS

Embodiment 1

Figure 1:
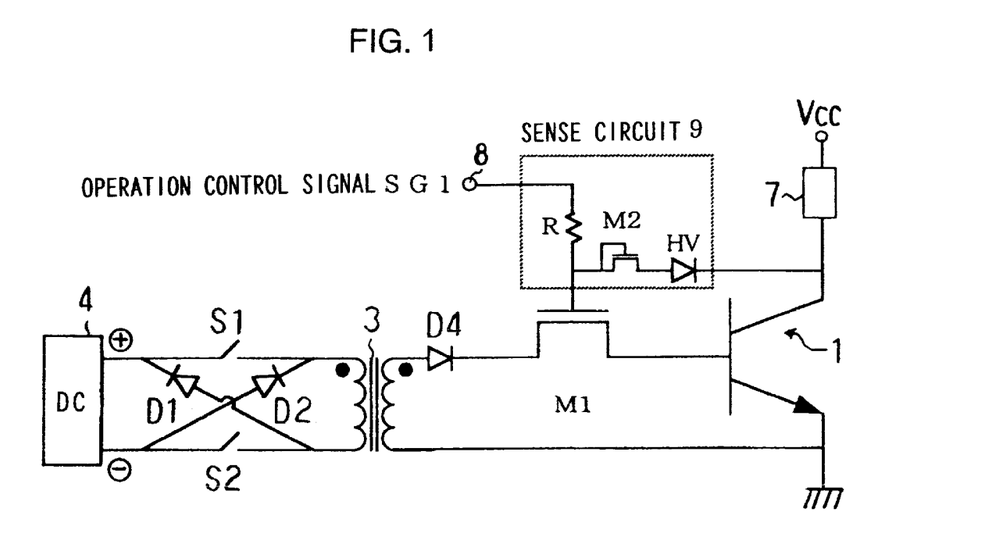
FIG. 1 shows a first preferred embodiment of the power supply circuit for driving a power transistor according to the present invention.

FIG. 1 is a figure showing the first preferred embodiment of the power supply circuit for driving a power transistor according to the present invention. A switching circuit which is the same as that in the forward type DC-DC converter shown in FIG. 6B described previously is provided to the primary winding of a transformer 3. This switching circuit comprises two switches S1 and S2 and two diodes D1 and D2. Each end of the primary winding of the transformer 3 is connected both to the positive side and to the negative side of a direct current power supply 4 via this switching circuit. It is to be noted that the primary winding and the secondary winding of the transformer 3 are wound in the same direction.

To the secondary winding of the transformer 3 there is provided a half wave rectification circuit comprising a diode D4 which allows electrical current to pass only when the primary side is connected in the positive direction with respect to the direct current power supply 4. In other words, the diode 4 is provided so as to allow electrical current to flow in the secondary side of the transformer 3 only when the switches S1 and S2 are ON. The output of this half wave rectification circuit is connected to the base (the control terminal) of a power transistor 1 via a MOSFET M1 which constitutes a current regulation circuit. The gate of this MOSFET M1 is connected to the output of a sense circuit 9.

The sense circuit 9 comprises a high voltage diode HV, a MOSFET M2, and a resistor R, and controls the voltage which is supplied to the gate of the MOSFET M1 according to the collector voltage of the power transistor 1. Furthermore, the collector terminal (power supply terminal) of the power transistor 1 is connected to a power supply Vcc via a load 7 (for example, an inductive load). It is to be noted that the load might also be connected to the emitter terminal of the power transistor 1. Furthermore, the operation control signal SG1 which controls the operation or stopping of the power transistor 1 is inputted from an input terminal 8. This operation control signal SG1 is inputted from some external control device not shown in the figures.

In the following the operation of this power supply circuit for driving a power transistor according to this first preferred embodiment of the present invention will be explained.

It will be supposed that the MOSFET M1 of the electrical current regulation circuit turns ON thanks to the operation control signal SG1 being ON and the switches S1 and S2 of the switching circuit are both ON. At this time, electrical current flows to the primary winding of the transformer 3 from the direct current power supply 4 via the switches S1 and S2. The core of the transformer 3 is excited by the energy of this electrical current. Since the energy of the direct current power supply 4 is supplied via the excited transformer 3 to its secondary side, accordingly the value of the electrical current which flows from the direct current power supply 4 to the primary side of the transformer 3 is greater than the amount thereof merely due to the excitation of the transformer 3. As a result, electrical current is supplied from the secondary winding of the transformer 3 via the diode D4 to the base of the power transistor 1.

Next, when the switches S1 and S2 are both turned OFF together, a portion of the excitation energy which has been accumulated in the core of the transformer 3 is returned to the direct current power supply 4 via the diodes D1 and D2. At this time no electrical current flows through the secondary winding of the transformer 3, since the diode D4 is present in the half wave rectification circuit. Furthermore, since there is no element except for the transformer 3 in the circuit shown in FIG. 1 in which energy can be magnetically accumulated, accordingly it is not possible for any electrical current to be supplied to the base of the power transistor 1 if no energy is supplied from the transformer 3. In other words, a pulse of electrical current is supplied to the base of the power transistor 1 when the switches S1 and S2 are turned ON and OFF together.

It is to be noted that the signal which turns the switches S1 and S2 ON and OFF together is supplied from some other circuit, not shown. However the structure of the circuit which supplies this signal is simplified, as will be explained hereinafter, since it is sufficient for the switches S1 and S2 to be opened and closed at a fixed period.

The function of electrical current regulation will now be explained. In the sense circuit 9, an input terminal 8 to which an operation control signal SG1 is inputted is connected to the collector terminal of the power transistor 1 via the resistor R, the MOSFET M2, and the high voltage diode HV. The point where the resistor R and the MOSFET M2 are connected together is connected to the gate of the MOSFET M1, constituting an electrical current regulation circuit. Accordingly, if the voltage at the collector of the power transistor 1 is high, the electrical current which flows through the MOSFET M2 becomes low, and the gate voltage of the MOSFET M1 becomes high. Conversely, if the voltage at the collector of the power transistor 1 is low, the gate voltage of the MOSFET M1 becomes low.

That is to say, when the collector voltage is high then the gate voltage of the MOSFET M1 becomes high, while when the collector voltage is low then the gate voltage becomes low. Accordingly, the resistance value of the MOSFET M1 varies according to the collector voltage. For example, when the collector voltage is high, the resistance value of the MOSFET M1 becomes low, and when the switches S1 and S2 are turned ON together a high electrical current is supplied to the base of the power transistor 1 from the secondary winding of the transformer 3. Conversely, if the base electrical current is too high and the collector voltage becomes low, then the resistance value of the MOSFET M1 becomes high, so that the electrical current which is supplied from the secondary winding of the transformer 3 to the base of the power transistor 1 when the switches S1 and S2 are turned ON together diminishes.

As described above, in the prior art the most suitable base electrical current was obtained by adjusting the ON and OFF time width of the pulsed electrical current which was supplied to the base. By contrast, with the first preferred embodiment, the amplitude of the pulsed electrical current is adjusted, so that as a result it is possible to obtain the most suitable base electrical current. Furthermore, since the base electrical current is adjusted according to the amplitude of the pulsed electrical current, it is sufficient for the switches S1 and S2 to be turned ON and OFF at a fixed period. In other words, it is possible to simplify the structure of the circuit which performs opening and closing control of the switches S1 and S2.

It is to be noted that, since a time lag is present in the opening and closing operation of the power transistor 1, accordingly the power transistor does not immediately go OFF even though the base electrical current is turned OFF. Accordingly, the power transistor 1 continues to operate in steady state if the period for turning the switches S1 and S2 ON and OFF together is shortened, even though it is being driven by a pulsed electrical current.

As explained above, in this power supply circuit for driving a power transistor according to the first preferred embodiment of the present invention, a pulse electrical current of a suitable level is produced directly from the direct current power supply without using any DC-DC converter, and is supplied to the base of the power transistor. By doing this, it is possible to reduce the number of structural elements in the circuit for driving the power transistor, and it is accordingly possible to anticipate reductions in size and cost. As compared with the circuit shown in FIG. 6B, with the first preferred embodiment, the choke coil L and the capacitor C become unnecessary. As compared with the circuit shown in FIG. 6C, the capacitor C becomes unnecessary. Furthermore, while it was necessary for the transformer 3 which was used in the circuit shown in FIG. 6C to accumulate energy while the switches S3 and S4 were ON, by contrast, with the circuit according to the first preferred embodiment, it is possible to make the transformer more compact, since it is only necessary for this transformer to transmit energy, not to accumulate it. Furthermore it is possible to simplify the structure even further, since no control circuit is used for feedback, such as was used for driving the power transistor in the prior art.

Moreover, with the power supply circuit for driving a power transistor according to the first preferred embodiment, the ON/OFF ratio for the switches S1 and S2 cannot be determined freely. That is to say, the energy for exciting the transformer 3 is accumulated in its core while the switches S1 and S2 are ON, and, when the switches S1 and S2 are turned OFF, the energy of excitation is returned to the direct current power supply 4. At this time, if the period in which the switches S1 and S2 are OFF is longer than the period in which they are ON, then the energy of excitation is all returned to the direct current power supply 4. However, if the period in which the switches S1 and S2 are OFF is shorter than the period in which they are ON, then, before the energy of excitation which has been accumulated in the core of the transformer 3 can be exhausted, the switches S1 and S2 are turned ON again, so that some of the energy of excitation remains in the core of the transformer 3. As a result, the energy of excitation gradually accumulates in the transformer 3.

The transformer 3 which is used in the drive circuit for a power transistor according to the first preferred embodiment cannot accumulate a great amount of energy, because its volume has been reduced since it has been made more compact. Accordingly there is a possibility that the core of this transformer 3 may become saturated due to the accumulation of excitation energy, so that it no longer functions correctly. Thus it is necessary for the ON/OFF ratio (the duty ratio) for the switches S1 and S2 to be less than or equal to 50%.

In the following, the volume of the transformer which is used in this power supply circuit according to the first preferred embodiment of the present invention will be compared with the volume of the transformer of the DC-DC converter in the related art.

First, the case of the flyback type DC-DC converter shown in FIG. 6C will be considered. Energy is accumulated in the core of the transformer 5 while the switches S3 and S4 are ON, and when these switches S3 and S4 go OFF, the energy is supplied to the load. Here, if the maximum value of the average drive electrical current which flows to the base of the power transistor 1 is termed I, and the voltage which is generated in the secondary winding of the transformer is termed V, and the switching frequency of the switches S3 and S4 is termed f, then the maximum value of energy which must be supplied to the load in one ON-OFF cycle of the switches is $I \times V/f$.

On the other hand, the maximum value of the energy which can be accumulated in a magnetic material of volume A is $A \times B_{max} \times B_{max}/\mu$. Here, $\mu$ is the permeability of the magnetic material, and $B_{max}$ is the saturation magnetic flux density of the magnetic material. Since with the circuit shown in FIG. 6C it is necessary to accumulate a greater amount of energy in the transformer 5 than that which is required to be supplied to the load, accordingly the volume A of the core of the transformer 5 is required to be greater than $(I \times V \times \mu)/(f \times B_{max} \times B_{max})$. In other words, it is necessary for the volume A of the core of the transformer 5 to satisfy the following Equation (1):

$$A > (I \times V \times \mu)/(f \times B_{max} \times B_{max}) \tag{1}$$

Next, the case of the forward type DC-DC converter shown in FIG. 6B will be considered. It is necessary to store the energy which is to be supplied to the load in the choke coil L while the switches S1 and S2 are OFF. Furthermore it is necessary to keep the ON/OFF ratio for the switches in such a forward type DC-DC converter less than or equal to 50% in order for the transformer not to become saturated, as described above. Accordingly, in one ON-OFF cycle of the switches, it is necessary to make the maximum value of energy supplied to the load while the switches are OFF to be greater than (I×V)/(2×f). In other words, it is necessary for the volume A of the core of the choke coil which can accumulate energy to satisfy the following Equation (2):

$$A > (I \times V \times \mu)/(2 \times f \times B\text{max} \times B\text{max}) \quad (2)$$

Thus, with the DC-DC converter in the related art, with either of the methods described above, the volume of the magnetic material of the transformer or of the choke coil is required to be at least (I×V×μ)/(2×f×Bmax×Bmax). Accordingly, it is not possible to make such a power supply circuit for driving a power transistor sufficiently compact. By contrast to the above situation, it is possible to reduce the volume of the transformer which is incorporated in the power supply circuit according to this first preferred embodiment of the present invention, since it is arranged for the transformer to be used only for transmitting energy, not to be used for accumulating energy in its magnetic material, other than the energy which is required for exciting the transformer itself. In other words, the volume of the power supply circuit according to the first preferred embodiment is not restricted by the above Equation (1) or (2).

It is to be noted that the power transistor according to the above explanation of this first preferred embodiment of the present invention, not only may be a standard type of bipolar power transistor or a SIT (Static Induction Transistor), but also could be a semiconductor device of the type disclosed in Japanese Patent Application No. H5-33419 (1993), which is a current drive type power transistor. In particular, it is possible to achieve further reduction in size of such a driving power supply circuit, since the electrical current amplification ratio with such a power transistor as disclosed in Japanese Patent Application No. H5-33419 (1993) is high.

Embodiment 2

Figure 2:
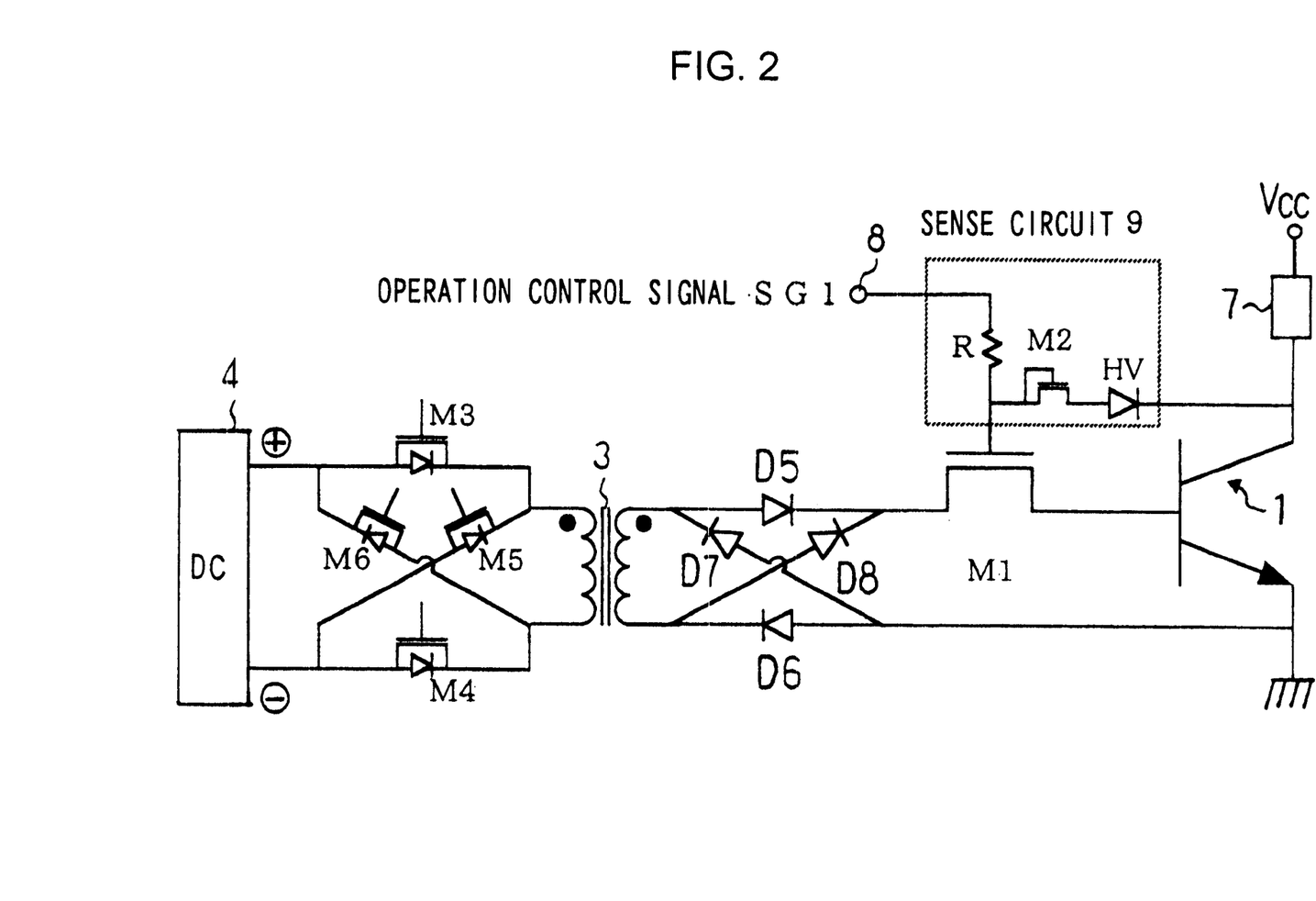
FIG. 2 shows a second preferred embodiment of the power supply circuit for driving a power transistor according to the present invention.

FIG. 2 is a figure showing a second preferred embodiment of the power supply circuit for driving a power transistor according to the present invention. With the power circuit according to the first preferred embodiment described above, energy is fed through the transformer 3 and is supplied to the power transistor 1 only while the switches S1 and S2 are ON. Accordingly there is a problem of low efficiency, since the time period in which the switches S1 and S2 are ON is half or less of that of a single cycle in which these switches go from ON to OFF and back to ON again. By contrast, with the power circuit according to the second preferred embodiment of the present invention, the efficiency is improved by increasing the time period in which energy can be fed through the transformer.

As shown in FIG. 2, there are provided four switches M3, M4, M5, and M6 in the switching circuit (each of which is constituted by a MOSFET and a diode connected in parallel), and furthermore on the secondary winding side of the transformer 3, a full wave rectification circuit comprising diodes D5, D6, D7, and D8 is used. It is to be noted that the structures of the sense circuit 9, the electrical current adjustment circuit M1 and so on are the same as those of the sense circuit 9, the electrical current adjustment circuit M1 and so on of the first preferred embodiment, shown in FIG. 1.

Now the operation of this power supply circuit for driving a power transistor according to this second preferred embodiment of the present invention will be explained. When the switches M3 and M4 are turned ON and the switches M5 and M6 are turned OFF, excitation energy is supplied to the transformer 3, and energy is supplied to the base of the power transistor 1 via the transformer 3 which has thus been excited, the full wave rectification circuit described above, and the electrical current regulation circuit M1, just as with the power supply circuit according to the first preferred embodiment.

After this the switches M3 and M4 are turned OFF and the switches M5 and M6 are turned ON. Due to this, the excitation energy of the transformer 3 is returned to the direct current power supply 4 via the switches M5 and M6. At this time it is possible for energy to be passed through the transformer 3 even though the excitation energy is being returned, since a full wave rectification circuit is used on the secondary side of the transformer 3. Accordingly, if the time period in which the switches M5 and M6 are ON is too long, after the excitation energy of the transformer 3 has all been returned to the direct current power supply 4, excitation energy in the reverse direction is accumulated in the transformer 3 via the switches M5 and M6.

In order to prevent the transformer 3 from undesirably becoming saturated by this excitation energy in the reverse direction, a time period is provided in which the switches M5 and M6 are turned OFF, and the switches M3 and M4 are kept OFF just as they are. During this time period in which the switches M3, M4, M5, and M6 are all kept OFF, the excitation energy of the transformer 3 is completely returned through the diodes which are provided internally to the switches M3 and M4, or the switches M5 and M6.

After the excitation energy has been completely returned, the flow of electrical current is interrupted by the internal diodes in the switches M3 and M4 or the switches M5 and M6, so that no energy is supplied to the transformer 3. Thus it is possible to prevent magnetic saturation of the transformer 3 by providing this time period in which the switches M3, M4, M5, and M6 are all OFF in this manner, and by setting the sum of this period and of the time period in which the switches M5 and M6 are ON to be longer than the time period in which the switches M3 and M4 are ON.

With this power supply circuit according to the second preferred embodiment of the present invention, it is possible to make the time period in which energy is transferred through the transformer 3 to be longer than half of a complete cycle. This matter will now be explained in detail with reference to FIG. 3.

Figure 3:
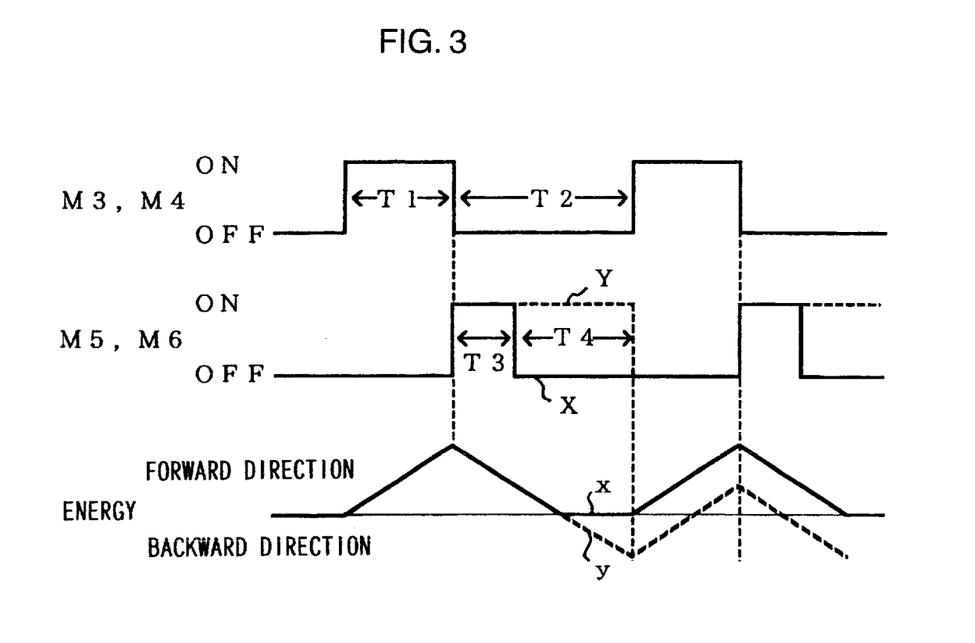
FIG. 3 is an operational waveform diagram for the power supply circuit shown in FIG. 2.

FIG. 3 is a waveform diagram showing the operation of the switches M3, M4, M5, and M6 and the amount energy at that time. In FIG. 3, the pulse width T1 is the period in which the switches M3 and M4 are ON, the pulse width T2 is the period in which the switches M3 and M4 are OFF, the pulse width T3 is the period in which the switches M5 and M6 are ON, and the pulse width T4 is the period in which all the switches are OFF. And the values of T1, T2, T3, and T4 must satisfy the following Equation (3):

$$T2 = T3 + T4 > T1 \quad (3)$$

If as shown by the broken line Y the time period in which the switches M5 and M6 are ON is the entire time period of T2 (T3+T4, i.e. the entire time period in which the switches M3 and M4 are OFF), then the energy in the reverse direction is accumulated in the transformer 3, as shown by the broken line y. However, if as shown by the solid line X the time period in which the switches M5 and M6 are ON is the time period T3 which is shorter than T2, then the change of energy is shown by the solid line x, and the energy in the reverse direction is not accumulated in the transformer 3.

According to the power supply circuit in this second preferred embodiment of the present invention as described above, it is possible to arrange that the time period during which energy can be supplied through the transformer is greater than half of a complete cycle. In other words, it is possible to enhance the efficiency of this drive power supply circuit, since it is possible to supply electrical current to the power transistor during more than half of a complete cycle of turning the switches ON and OFF.

Embodiment 3

Figure 4:
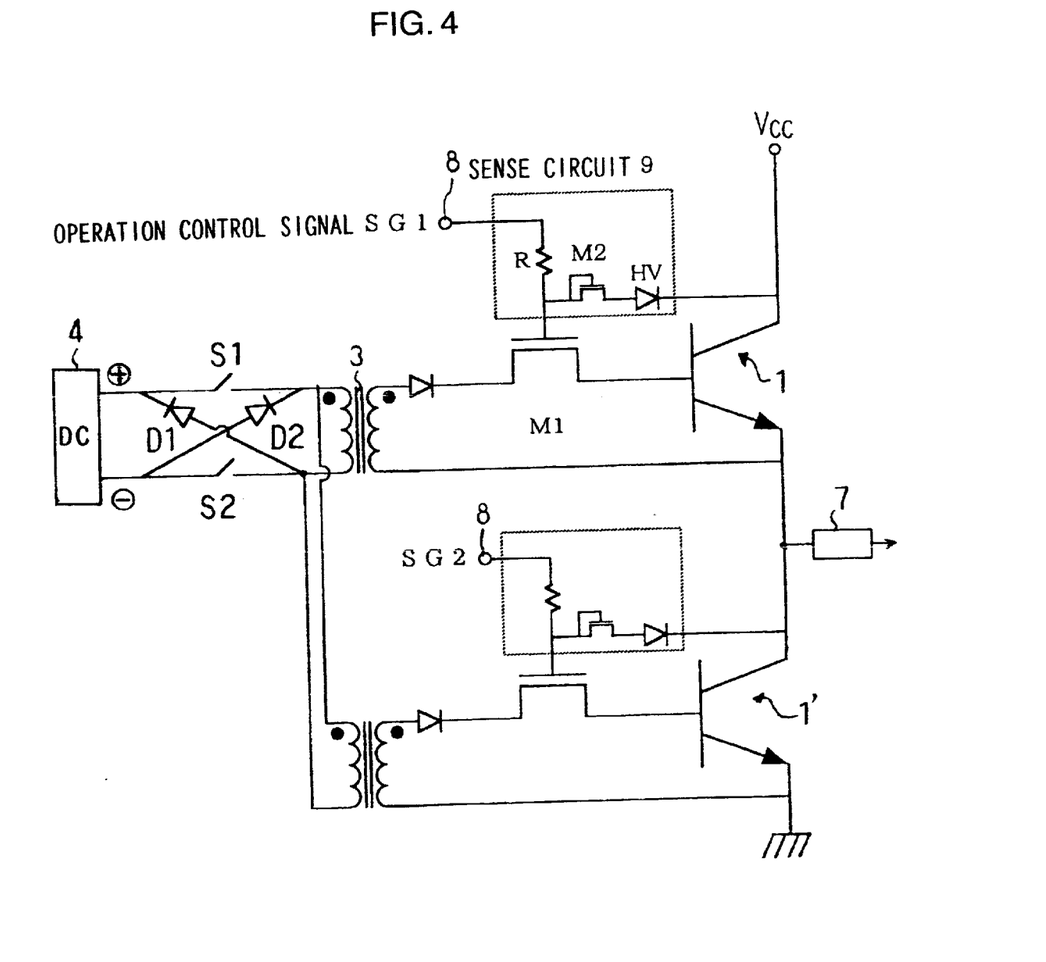
FIG. 4 shows a third preferred embodiment of the power supply circuit for driving a power transistor according to the present invention.

FIG. 4 is a figure showing a third preferred embodiment of the power supply circuit for driving a power transistor according to the present invention. This figure shows the power supply circuit for driving a power transistor according to the present invention is used as a circuit for driving a power transistor of the H bridge circuit type or the inverter circuit type. It is to be noted that, in FIG. 4, only the half bridge portions of the H bridge is shown. In other words, at the right side end of a load 7 shown in FIG. 4, there is connected a remaining half bridge portion of the circuit, the structure of which is the same as that shown in the figure. Furthermore, the operational control signals SG1 and SG2 are of mutually opposite phase, and the power transistors 1 and 1A is operated in mutually opposite phases.

In the circuit shown in FIG. 4, the switching circuit which comprises the switches S1 and S2 and the diodes D1 and D2 is connected in parallel to the two primaries of the two transformers. It is possible to further reduce the size and the cost of the device by having the same switching circuit jointly with a plurality of transformers in this manner, as contrasted with the alternative of providing two examples of the power supply circuit shown in FIG. 1.

Embodiment 4

Figure 5:
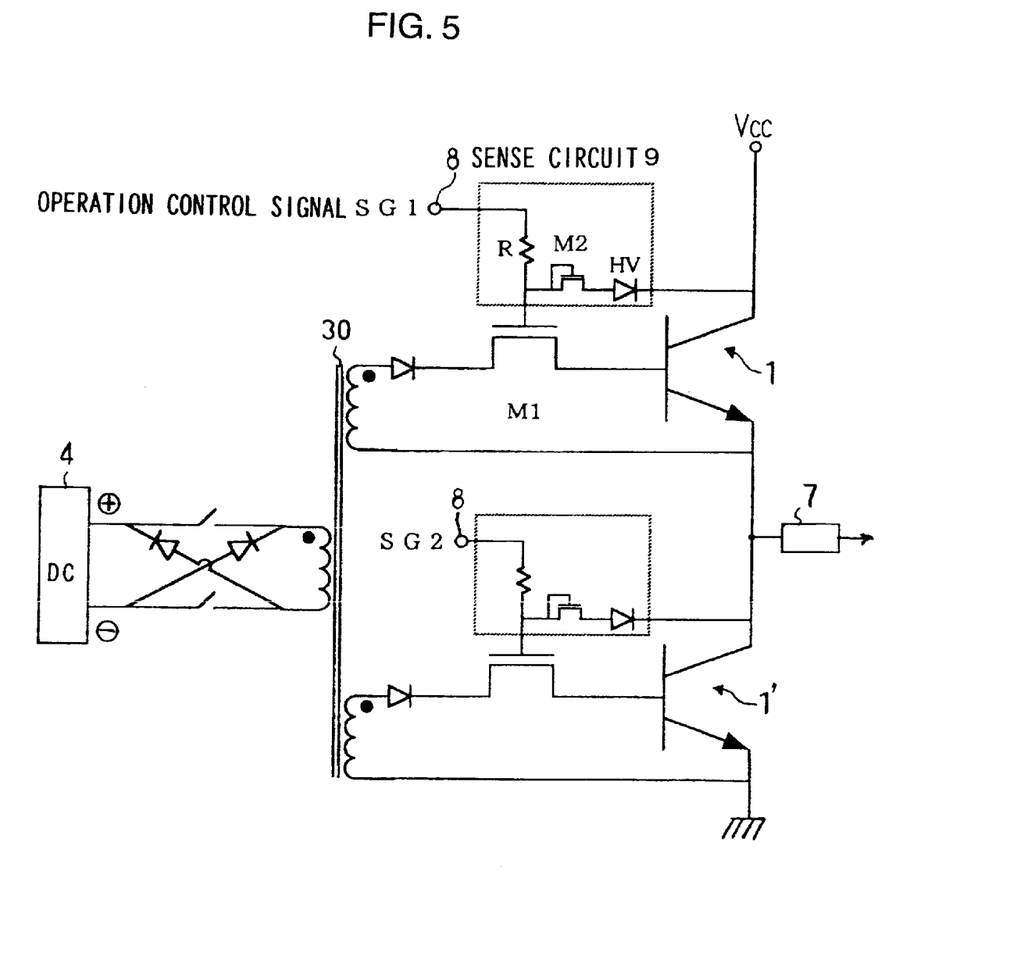
FIG. 5 shows a fourth preferred embodiment of the power supply circuit for driving a power transistor according to the present invention.

FIG. 5 is a figure showing a fourth preferred embodiment of the power supply circuit for driving a power transistor according to the present invention. This power supply circuit for driving a power transistor according to the fourth preferred embodiment is a version of the power supply circuit shown in FIG. 4, further simplified.

In the circuit shown in FIG. 5, a transformer 30 which is provided with two secondary windings is employed. In addition to the structure of the circuit shown in FIG. 4, the cores of the transformers are provided in common. The other portions of the structure except for the transformer 30 are the same as in the power supply circuit shown in FIG. 4. With this structure, it is possible further to reduce the size and the cost of the power supply circuit, as contrasted with the circuit shown in FIG. 4.

The above described embodiments are examples, and various modifications can be made without departing from the spirit and scope of the invention. For example, although in the power supply circuit according to the third preferred embodiment described above the power supply circuit shown in FIG. 1 was used, it would also be possible, as an alternative, to use the power supply circuit shown in FIG. 2. Moreover, in the same manner, the power supply circuit according to the fourth preferred embodiment described above is not to be considered as being limited to incorporating the power supply circuit shown in FIG. 1; it could alternatively incorporate the power supply circuit shown in FIG. 2. Yet further, although in the power supply circuits according to the third and the fourth preferred embodiments described above two power transistors were shown as being provided to the secondary sides of the transformer or transformers, it would also be possible to provide more than two such power transistors.

The disclosure of the following priority application is herein incorporated by reference: Japanese Patent Application No. 2001-68382 filed Mar. 12, 2001.

What is claimed is:

1. A power supply circuit for driving a power transistor, comprising:

a direct current power supply;

a transformer;

a switching circuit which controls pulse electrical current to flow through a primary winding of said transformer by connecting both ends of the primary winding of said transformer to both output ends of said direct current power supply in one of positive and negative directions;

a half wave rectification circuit which allows electrical current to flow in a secondary winding of said transformer when electrical current flows in the primary winding of said transformer in one or the other of the positive direction and the negative direction; and an electrical current regulation circuit which is provided between an output of said half wave rectification circuit and a control terminal of said power transistor, and whose resistance value changes according to a collector voltage of said power transistor.

2. A power supply circuit for driving a power transistor according to claim 1, wherein:

if the maximum value of the average drive electrical current which flows to the control terminal of said power transistor is termed I, the voltage which is generated in the secondary winding of said transformer is termed V, the switching frequency of said switching circuit is termed f, the permeability of the magnetic material of said transformer is termed $\mu$, and the saturation magnetic flux density of the magnetic material is termed Bmax, then the volume of the entire quantity of magnetic material which is used in said drive power supply circuit is less than $(I \times V \times \mu)/(2 \times f \times Bmax \times Bmax)$.

3. A power supply circuit for driving a plurality of power transistors, comprising:

a direct current power supply;

a plurality of transformers;

a switching circuit provided in common to said plurality of transformers which controls pulse electrical current to flow through a primary winding of said transformers by connecting both ends of the primary winding of each of said plurality of transformers to both output ends of said direct current power supply in one of positive and negative directions;

a plurality of half wave retification circuits which allows electrical current to flow in secondary winding of each of said plurality of transformers when electrical current flows in the primary winding of each of said transformers in one or the other of the positive direction and the negative directions; and a plurality of electrical current regulation circuit provided between an output of each of said half wave rectification circuits and a control terminal of each of said power transistors, and whose resistance value changes according to a collector voltage of said power transistor; wherein each of said half wave rectification circuits and said electrical current regulation circuits and said power transistors are connected to the secondary winding of each of said plurality of transformers, and drive electrical power is supplied from said direct current power supply to said plurality of said power transistors via said switching circuit.

4. A power supply circuit for driving a plurality of power transistors, comprising:

a direct current power supply;

a plurality of transformers;

a switching circuit provided in common to said plurality of transformers, which flows pulse electrical current through a primary winding of each of said transformers by connecting both ends of the primary winding of each of said transformers to both output ends of said direct current power supply in positive and negative directions alternately;

a plurality of full wave rectification cicuits which allows electrical current to flow in a secondary winding of each of said plurality of transformers when electrical current flows in the primary winding of each of said transformers in the positive direction and the negative directions; and plurality of electrical current regulation circuit provided between an output of each of said full wave rectification circuits and a control terminal of each of said power transistors, and whose resistance value changes according to a collector voltage of said power transistors; wherein each of said full wave rectification circuits and said electrical current regulation circuits and said power transistors are connected to the secondary winding of each of said plurality of transformers, and drive electrical power is supplied from said direct current power supply to said plurality of said power transistors via said switching circuit.

5. A power supply circuit for driving a plurality of power transistors, comprising:

a direct current power supply;

a plurality of transformers;

a switching circuit provided in common to said plurality of power transistors which controls pulse electrical current to flow through a primary winding of each of said transformers to transformers by connecting both ends of the primary winding of each of said transformers to both output ends of said direct current power supply in one of positive and negative directions;

a plurality of half wave rectification circuits which allow eletrical current to flow in a secondary winding of each of said transformers when electrical current flows in the primary winding of each of said transformers in one or the other of the positive directions and the negative direction; and a plurality of electrical current regulation circuit provided between an output of each of said half wave rectification circuits and a control terminal of each of said plurality of power transistors, and whose resistance value changes according to a collector voltage of each of said plurality of power transistors; wherein each of said transformers has a plurality of secondary windings, and each of a plurality of said half wave rectification circuits and said electrical current regulation circuits and said power transistors are connected to each of a plurality of secondary windings, and drive electrical power is supplied from said direct current power supply to each of said plurality of said power transistors via said switching circuit and each of said plurality of transformers.

6. A power supply circuit for driving a plurality of power transistors, comprising:

a direct current power supply;

a plurality of transformers;

a switching circuit provided in common to said plurality of power transistors which flows pulse electrical current through a primary winding of each of said transformers by connecting both ends of the primary winding of each of said transformers to both output ends of said direct current power supply in positive and negative directions alternately;

a plurality of full wave rectification circuits which allow electrical current to flow in a secondary winding of each of said transformers when electrical current flows in the primary winding of each of said transformers in the positive direction and the negative directions; and a plurality of electrical current regulation circuits provided between an output of each of said full wave rectification circuits and a control terminal of each of said power transistors, and whose resistance value changes according to a collector voltage of each of said power transistors, wherein each of said transformers has a plurality of secondary windings, and each of said plurality of said full wave rectification circuits and said electrical current regulation circuits and said power transistors are connected to each of a plurality of secondary windings, and drive electrical power is supplied from said direct current power supply to each of said plurality of said power transistors via said switching circuit and each of said transformers.

7. A power supply circuit for driving a power transistor, comprising:

a direct current power supply;

a transformer;

a switching circuit which flows pulse electrical current through a primary winding of said transformer by connecting both ends of the primary winding of said transformer to both output ends of said direct current power supply in positive and negative directions alternately;

a full wave rectification circuit which allows electrical current to flow in a secondary winding of said transformer when electrical current flows in the primary winding of said transformer in the positive direction and the negative directions; and an electrical current regulation circuit which is provided between an output of said half wave rectification circuit and a control terminal of said power transistor, and whose resistance value changes according to a collector voltage of said power transistor.

8. A power supply circuit for driving a power transistor according to claim 5, wherein:

if the maximum value of the average drive electrical current which flows to the control terminal of said power transistor is termed I, the voltage which is generated in the secondary winding of said transformer is termed V, the switching frequency of said switching circuit is termed f, the permeability of the magnetic material of said transformer is termed $\mu$, and the saturation magnetic flux density of the magnetic material is termed Bmax, then the volume of the entire quantity of magnetic material which is used in said drive power supply circuit is less than $(I \times V \times \mu)/(2 \times f \times Bmax \times Bmax)$.

* * * * *